(12) United States Patent
Eronen et al.

(10) Patent No.: US 10,051,403 B2
(45) Date of Patent: Aug. 14, 2018

(54) CONTROLLING AUDIO RENDERING (71) Applicant: Nokia Technologies Oy, Espoo (FI)

(72) Inventors: Antti Johannes Eronen, Tampere (FI); Arto Juhani Lehtiniemi, Lempaala (FI); Jussi Artturi Leppanen, Tampere (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/429,998

(22) Filed: Feb. 10, 2017

(65) Prior Publication Data

US 2017/0245092 A1 Aug. 24, 2017

(30) Foreign Application Priority Data

Feb. 19, 2016 (EP) ..................................... 16156590

(51) Int. Cl.
*H03G 3/00* (2006.01)
*H04S 7/00* (2006.01)
*G06F 3/16* (2006.01)

(52) U.S. Cl.
CPC ............... *H04S 7/40* (2013.01); *G06F 3/162* (2013.01); *H03G 3/00* (2013.01); *H04S 7/307* (2013.01); *H04S 2400/11* (2013.01)

(58) Field of Classification Search
CPC ........ H04S 7/40; H04S 7/307; H04S 2400/11; G06F 3/162; H03G 3/00
See application file for complete search history.

(56) References Cited

U.S. PATENT DOCUMENTS

| | | | |
|---|---|---|---|
| 7,612,275 B2 | 11/2009 | Seppanen et al. | |
| 7,659,471 B2 | 2/2010 | Eronen | |
| 7,876,914 B2 | 1/2011 | Grosvenor et al. | |
| 8,301,076 B2 | 10/2012 | Grandinetti et al. | |
| 9,280,961 B2 | 3/2016 | Eronen et al. | |
| 9,313,599 B2 | 4/2016 | Tammi et al. | |
| 9,414,153 B2* | 8/2016 | Shigenaga | G06F 3/16 |

(Continued)

FOREIGN PATENT DOCUMENTS

| EP | 3 174 005 A1 | 5/2017 |
|---|---|---|
| GB | 2521175 A | 6/2015 |

(Continued)

OTHER PUBLICATIONS

Chou et al., "Robust Singing Detection in Speech/Music Discriminator Design", IEEE International Conference on Acoustics, Speech, and Signal Processing, 2001, May 7-11, 2001, pp. 865-868.

(Continued)

*Primary Examiner* — Andrew L Sniezek
(74) *Attorney, Agent, or Firm* — Alston & Bird LLP (57) ABSTRACT

A method comprising: displaying a spatio-temporal graph that visually indicates the positions of a sound object at each time in a range of times and, in addition, simultaneously indicates a state of the sound object over the range of times; enabling user adaptation of the spatio-temporal graph to change a position of the sound object during at least a portion of the range of times and/or a state of the sound object over at least a portion of the range of times; and enabling rendering of spatial audio output using the position and state of the sound object indicated by the adapted spatio-temporal graph.

20 Claims, 4 Drawing Sheets

(56) References Cited

U.S. PATENT DOCUMENTS

| | | |
|---|---|---|
| 9,456,289 B2 | 9/2016 | Tammi et al. |
| 2007/0230729 A1 | 10/2007 | Naylor et al. |
| 2008/0252637 A1 | 10/2008 | Berndt et al. |
| 2012/0076304 A1 | 3/2012 | Suzuki |
| 2015/0055770 A1 | 2/2015 | Spittle et al. |

FOREIGN PATENT DOCUMENTS

| | | |
|---|---|---|
| GB | 254 3275 A | 4/2017 |
| GB | 254 3276 A | 4/2017 |
| WO | 2002/003754 A1 | 1/2002 |
| WO | 2013/144417 A1 | 10/2013 |
| WO | 2013/164661 A1 | 11/2013 |
| WO | 2014/001849 A1 | 1/2014 |
| WO | 2014/091375 A1 | 6/2014 |
| WO | 2014/130221 A1 | 8/2014 |
| WO | 2014/147551 A1 | 9/2014 |
| WO | 2014/162171 A1 | 10/2014 |
| WO | 2014/183879 A1 | 11/2014 |
| WO | 2014/184706 A1 | 11/2014 |
| WO | 2014/207297 A1 | 12/2014 |
| WO | 2015/086895 A1 | 6/2015 |
| WO | 2016/102737 A1 | 6/2016 |
| WO | 2016/203113 A1 | 12/2016 |

OTHER PUBLICATIONS

Shenoy et al., "Singing Voice Detection for Karaoke Application", Proceedings of SPIE—The International Society for Optical Engineering, Jul. 2005, pp. 752-762.

Schuller et al., "Feature Selection and Stacking for Robust Discrimination of Speech, Monophonic Singing, and Polyphonic Music", IEEE International Conference on Multimedia and Expo, Jul. 6, 2005, 4 pages.

Huang et al., "Acoustic Source Localization in Mixed Field Using Spherical Microphone Arrays", EURASIP Journal on Advances in Signal Processing, Dec. 2014, pp. 1-16.

"Self Localization & Synchronization of Microphones", Audio Research Group, Retrieved on Jan. 27, 2017, Webpage available at : http://arg.cs.tut.fi/research/self-localization.

Pertila et al., "Passive Temporal Offset Estimation of Multichannel Recordings of an Ad-Hoc Microphone Array", IEEE Transactions on Audio, Speech, and Language Processing, vol. 21, No. 11, Nov. 2013, pp. 2393-2402.

Ionescu et al., "3D Localization and Tracking of Objects UsingMiniature Microphones", Wireless Sensor Network, vol. 3, No. 5, May 2011, pp. 147-157.

"Unique Technology", Quuppa, Retrieved on Jan. 27, 2017, Webpage available at : http://quuppa.com/technology/.

Lienhart et al.,"Universal Synchronization Scheme for Distributed Audio-Video Capture on Heterogeneous computing Platforms", Proceedings of the eleventh ACM international conference on Multimedia, Nov. 2-8, 2003, pp. 263-266.

Gallo et al., "3D-Audio Matting, Postediting, and RerenderingFrom Field Recordings", EURASIP Journal on Advances in Signal Processing, Dec. 2007, 16 pages.

Malczewska et al., "Low Delay Audio Streaming for a 3D Audio Recording System", Linux Audio Conference, Jan. 2015, 8 pages.

Vesa et al., "Automatic estimation of reverberation time from binaural signals", IEEE International Conference on Acoustics, Speech, and Signal Processing, Mar. 23, 2005, pp. 281-284.

Hamel et al., "Automatic Identification of Instrument Classes in Polyphonic and Poly-Instrument Audio", International Society for Music Information Retrieval, 2009, 6 pages.

Turnbull et al., "Semantic Annotation and Retrieval of Music and Sound Effects", IEEE Transactions on Audio, Speech, and Language Processing, vol. 16, No. 2, Feb, 2008, pp. 467-476.

Ness et al., "Improving Automatic Music Tag Annotation Using Stacked Generalization of Probabilistic SVM Outputs", Proceedings of the 17th ACM international conference on Multimedia, Oct. 19-24, 2009, pp. 705-708.

Bertin-Mahieux et al., "Autotagger: A Model for Predicting Social Tags from Acoustic Features on Large Music Databases", Journal of New Music Research, vol. 37, No. 2, Aug. 15, 2008, pp. 1-21.

Vaizman et al., "Codebook Based Audio Feature Representation for Music Information Retrieval", IEEE transactions on Audio, Speech and Language Processing, Dec. 2013, pp. 1-11.

Miotto et al., "A Generative Context Model for Semantic Music Annotation and Retrieval", IEEE Transactions on Audio, Speech, and Language Processing, vol. 20, No. 4, May, 2012, pp. 1096-1108.

Ellis et al., "A Bag of Systems Representation for Music Auto-Tagging", IEEE Transactions on Audio, Speech, and Language Processing, vol. 21, No. 12, Dec. 2013, pp. 2554-2569.

Knees et al., "A Survey of Music Similarity and Recommendation from Music Context Data", ACM Transactions on Multimedia Computing, Communications, and Applications, vol. 10, No. 1, Dec. 2013, pp. 1-21.

Saari et al., "Using Semantic Layer Projection for Enhancing Music Mood Prediction With Audio Features", Proceedings of the Sound and Music Computing Conference, Aug. 2013, 7 Pages.

"Freeverb", Stanford, Retrieved on Jan. 30, 2017, Webpage available at : https://ccrma.stanford.edu/~jos/pasp/Freeverb.html.

GB Non-Provisional Application No. 1518023.5, "Audio signal analysis", filed on Oct. 12, 2015, 62 pages.

Braasch et al., "A Sound-Source Tracking Device to Track Multiple Talkers From Microphone Array and Lavalier Microphone Data", 19th International Congress on Acoustics, Sep. 2-7, 2007, pp. 1-6.

Lu et al., "Content Analysis for Audio Classification and Segmentation", IEEE Transactions on Speech and Audio Processing, vol. 10, No. 7, Oct. 2002, pp. 504-516.

Zhang et al., "Audio Content Analysis for Online Audiovisual Data Segmentation and Classification", IEEE Transactions on Speech and Audio Processing, vol. 9, No. 4, May, 2001, pp. 441-457.

Pohjalainen, "Methods of Automatic Audio Content Classification", Thesis, Nov. 16, 2007, 123 Pages.

"Information technology—High efficiency coding and media delivery in heterogeneous environments—Part 3: 3D audio", ISO/IEC DIS 23008-3, Jul. 25, 2014, 433 pages.

"Live Television Audio Mixing—Nov. BYU Volleyball Mixlapse", Youtube, Retrieved on Jan. 23, 2017, Webpage available at : https://www.youtube.com/watch?v=hukWwBEvMT4.

"MPEG-H 3D Audio", Wikipedia, Retrieved on Jan. 23, 2017, Webpage available at : https://en.wikipedia.org/wiki/MPEG-H_3D_Audio.

Search Report received for corresponding United Kingdom Patent Application No. 1518025.0, dated Mar. 31, 2016, 3 pages.

Search Report received for corresponding United Kingdom Patent Application No. 1518023.5, dated Mar. 31, 2016, 3 pages.

Extended European Search Report received for corresponding European Patent Application No. 15197128.0, dated Apr. 15, 2016, 6 pages.

Extended European Search Report received for corresponding European Patent Application No. 16156590.8, dated Sep. 13, 2016, 7 pages.

\* cited by examiner

CONTROLLING AUDIO RENDERING

TECHNOLOGICAL FIELD

Embodiments of the present invention relate to controlling audio rendering. In particular, they relate to controlling audio rendering of a sound scene comprising multiple sound objects.

BACKGROUND

A sound scene in this document is used to refer to the arrangement of sound sources in a three-dimensional space. When a sound source changes position, the sound scene changes. When the sound source changes its audio properties such as its audio output, then the sound scene changes.

A sound scene may be defined in relation to recording sounds (a recorded sound scene) and in relation to rendering sounds (a rendered sound scene).

Some current technology focuses on accurately reproducing a recorded sound scene as a rendered sound scene at a distance in time and space from the recorded sound scene. The recorded sound scene is encoded for storage and/or transmission.

A sound object within a sound scene may be a source sound object that represents a sound source within the sound scene or may be a recorded sound object which represents sounds recorded at a particular microphone. In this document, reference to a sound object refers to both a recorded sound object and a source sound object. However, in some examples, the sound object may be only source sound objects and in other examples a sound object may be only a recorded sound object.

By using audio processing it may be possible, in some circumstances, to convert a recorded sound object into a source sound object and/or to convert a source sound object into a recorded sound object.

It may be desirable in some circumstances to record a sound scene using multiple microphones. Some microphones, such as Lavalier microphones, or other portable microphones, may be attached to or may follow a sound source in the sound scene. Other microphones may be static in the sound scene.

The combination of outputs from the various microphones defines a recorded sound scene. However, it may not always be desirable to render the sound scene exactly as it has been recorded. It is therefore desirable, in some circumstances, to enable a post-recording user to adapt the recorded sound scene to produce an alternative rendered sound scene.

BRIEF SUMMARY

According to various, but not necessarily all, embodiments of the invention there is provided a method comprising: displaying a spatio-temporal graph that visually indicates the positions of a sound object at each time in a range of times and, in addition, simultaneously indicates a state of the sound object over the range of times;
enabling user adaptation of the spatio-temporal graph to change a position of the sound object during at least a portion of the range of times and/or a state of the sound object over at least a portion of the range of times; and enabling rendering of spatial audio output using the position and state of the sound object indicated by the adapted spatio-temporal graph.

According to various, but not necessarily all, embodiments of the invention there is provided examples as claimed in the appended claims.

BRIEF DESCRIPTION

For a better understanding of various examples that are useful for understanding the detailed description, reference will now be made by way of example only to the accompanying drawings in which.

DETAILED DESCRIPTION

Figure 1:
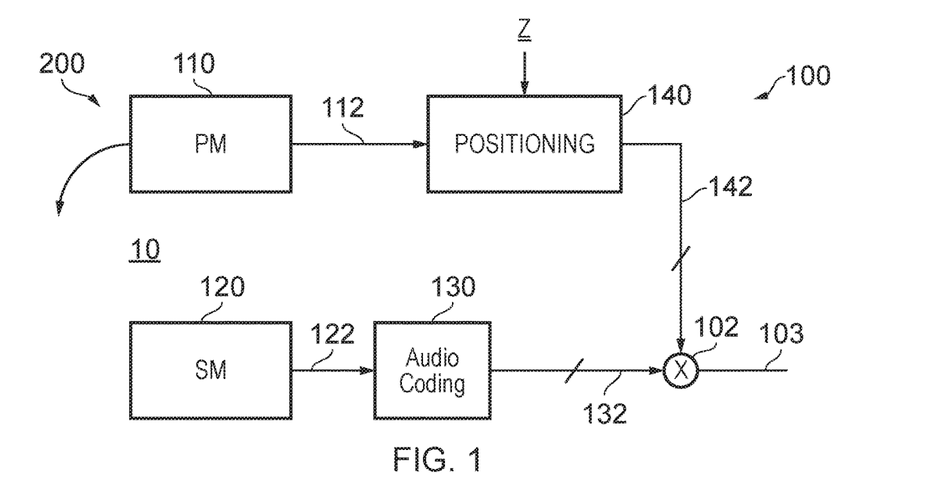
FIG. 1 illustrates an example of a system and also an example of a method for recording and encoding a sound scene.

FIG. 1 illustrates an example of a system 100 and also an example of a method 200. The system 100 and method 200 record a sound scene 10 and process the recorded sound scene to enable an accurate rendering of the recorded sound scene as a rendered sound scene for a listener at a particular position (the origin) within the recorded sound scene 10.

In this example, the origin of the sound scene is at a microphone 120. In this example, the microphone 120 is static. It may record one or more channels, for example it may be a microphone array.

In this example, only a single static microphone 120 is illustrated. However, in other examples multiple static microphones 120 may be used independently. In such circumstances the origin may be at any one of these static microphones 120 and it may be desirable to switch, in some circumstances, the origin between static microphones 120 or to position the origin at an arbitrary position within the sound scene.

The system 100 also comprises one or more portable microphones 110. The portable microphone 110 may, for example, move with a sound source within the recorded sound scene 10. This may be achieved, for example, using a boom microphone or, for example, attaching the microphone to the sound source, for example, by using a Lavalier microphone. The portable microphone 110 may record one or more recording channels.

Figure 2:
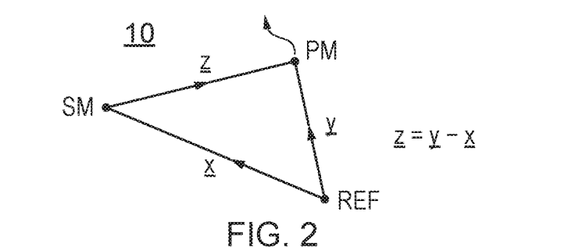
FIG. 2 schematically illustrates relative positions of a portable microphone (PM) and static microphone (SM) relative to an arbitrary reference point (REF)

FIG. 2 schematically illustrates the relative positions of the portable microphone (PM) 110 and the static microphone (SM) 120 relative to an arbitrary reference point (REF). The position of the static microphone 120 relative to the reference point REF is represented by the vector x. The position of the portable microphone PM relative to the reference point REF is represented by the vector y. The relative position of the portable microphone 110 from the static microphone SM is represented by the vector z. It will be understood that z=y−x. As the static microphone SM is static, the vector x is constant. Therefore, if one has knowledge of x and tracks variations in y, it is possible to also track variations in z. The vector z gives the relative position of the portable microphone 110 relative to the static microphone 120 which is the origin of the sound scene 10. The vector z therefore positions the portable microphone 110 relative to a notional listener of the recorded sound scene 10.

There are many different technologies that may be used to position an object including passive systems where the positioned object is passive and does not produce a signal and active systems where the positioned object produces a system. An example of a passive system, used in the Kinect™ device, is when an object is painted with a non-homogenous pattern of symbols using infrared light and the reflected light is measured using multiple cameras and then processed, using the parallax effect, to determine a position of the object. An example of an active system is when an object has a transmitter that transmits a radio signal to multiple receivers to enable the object to be positioned by, for example, trilateration. An example of an active system is when an object has a receiver or receivers that receive a radio signal from multiple transmitters to enable the object to be positioned by, for example, trilateration.

When the sound scene 10 as recorded is rendered to a user (listener) by the system 100 in FIG. 1, it is rendered to the listener as if the listener is positioned at the origin of the recorded sound scene 10. It is therefore important that, as the portable microphone 110 moves in the recorded sound scene 10, its position z relative to the origin of the recorded sound scene 10 is tracked and is correctly represented in the rendered sound scene. The system 100 is configured to achieve this.

In the example of FIG. 1, the audio signals 122 output from the static microphone 120 are coded by audio coder 130 into a multichannel audio signal 132. If multiple static microphones were present, the output of each would be separately coded by an audio coder into a multichannel audio signal.

The audio coder 130 may be a spatial audio coder such that the multichannels 132 represent the sound scene 10 as recorded by the static microphone 120 and can be rendered giving a spatial audio effect. For example, the audio coder 130 may be configured to produce multichannel audio signals 132 according to a defined standard such as, for example, binaural coding, 5.1 surround sound coding, 7.1 surround sound coding etc. If multiple static microphones were present, the multichannel signal of each static microphone would be produced according to the same defined standard such as, for example, binaural coding, 5.1 surround sound coding, 7.1 and in relation to the same common rendered sound scene.

The multichannel audio signals 132 from one or more of the static microphones 120 are mixed by mixer 102 with multichannel audio signals 142 from the one or more portable microphones 110 to produce a multi-microphone multichannel audio signal 103 that represents the recorded sound scene 10 relative to the origin and which can be rendered by an audio decoder corresponding to the audio coder 130 to reproduce a rendered sound scene to a listener that corresponds to the recorded sound scene when the listener is at the origin.

The multichannel audio signal 142 from the, or each, portable microphone 110 is processed before mixing to take account of any change in position of the portable microphone 110 relative to the origin at the static microphone 120.

The audio signals 112 output from the portable microphone 110 are processed by the positioning block 140 to adjust for a change in position of the portable microphone 110 relative to the origin at the static microphone 120. The positioning block 140 takes as an input the vector z or some parameter or parameters dependent upon the vector z. The vector z represents the relative position of the portable microphone 110 relative to the origin at the static microphone 120.

The positioning block 140 may be configured to adjust for any time misalignment between the audio signals 112 recorded by the portable microphone 110 and the audio signals 122 recorded by the static microphone 120 so that they share a common time reference frame. This may be achieved, for example, by correlating naturally occurring or artificially introduced (non-audible) audio signals that are present within the audio signals 112 from the portable microphone 110 with those within the audio signals 122 from the static microphone 120. Any timing offset identified by the correlation may be used to delay/advance the audio signals 112 from the portable microphone 110 before processing by the positioning block 140.

The positioning block 140 processes the audio signals 112 from the portable microphone 110, taking into account, for example, the relative orientation (Arg(z)) of that portable microphone 110 relative to the origin at the static microphone 120.

The audio coding of the static microphone audio signals 122 to produce the multichannel audio signal 132 assumes a particular orientation of the rendered sound scene relative to an orientation of the recorded sound scene and the audio signals 122 are encoded to the multichannel audio signals 132 accordingly.

The relative orientation Arg (z) of the portable microphone 110 in the recorded sound scene 10 is determined and the audio signals 112 representing the sound object are coded to the multichannels defined by the audio coding 130 such that the sound object is correctly oriented within the rendered sound scene at a relative orientation Arg (z) from the listener. For example, the audio signals 112 may first be mixed or encoded into the multichannel signals 142 and then a transformation T may be used to rotate the multichannel audio signals 142, representing the moving sound object, within the space defined by those multiple channels by Arg (z).

The portable microphone signals 112 may additionally be processed to control the perception of a distance D of the sound object from the listener in the rendered sound scene, for example, to match the distance |z| of the sound object from the origin in the recorded sound scene 10. This can be useful when binaural coding is used so that the sound object is, for example, externalized from the user and appears to be at a distance rather than within the user's head, between the user's ears. The positioning block 140 modifies the multichannel audio signal 142 to modify the perception of distance.

Figure 3:
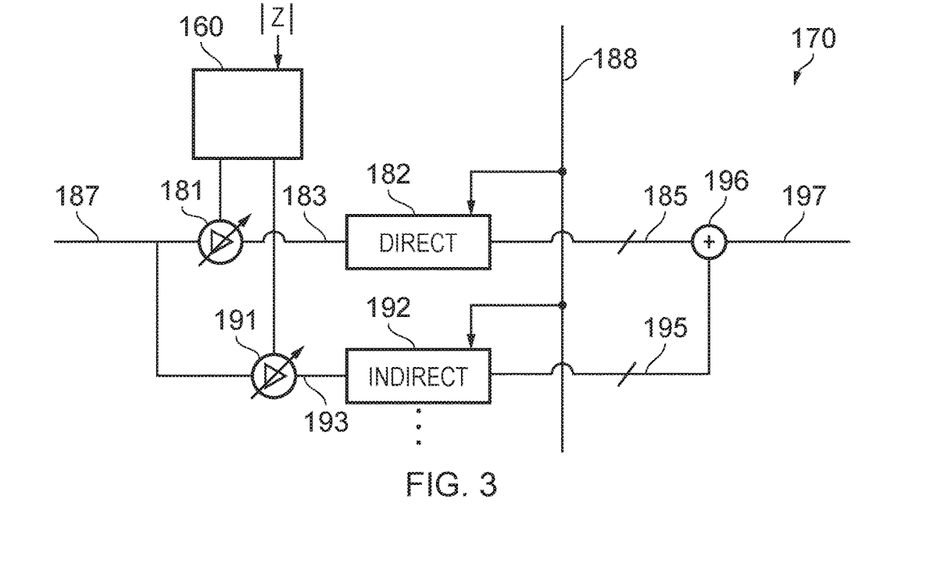
FIG. 3 illustrates a module which may be used, for example, to perform the functions of the positioning block, orientation block and distance block of the system.

FIG. 3 illustrates a module 170 which may be used, for example, to perform the functions of the positioning block 140 in FIG. 1. The module 170 may be implemented using circuitry and/or programmed processors.

The Figure illustrates the processing of a single channel of the multichannel audio signal 142 before it is mixed with the multichannel audio signal 132 to form the multi-microphone multichannel audio signal 103. A single input channel of the multichannel signal 142 is input as signal 187.

The input signal 187 passes in parallel through a "direct" path and one or more "indirect" paths before the outputs from the paths are mixed together, as multichannel signals, by mixer 196 to produce the output multichannel signal 197. The output multichannel signal 197, for each of the input channels, are mixed to form the multichannel audio signal 142 that is mixed with the multichannel audio signal 132.

The direct path represents audio signals that appear, to a listener, to have been received directly from an audio source and an indirect path represents audio signals that appear to a listener to have been received from an audio source via an indirect path such as a multipath or a reflected path or a refracted path.

A distance block 160 by modifying the relative gain between the direct path and the indirect paths, changes the perception of the distance D of the sound object from the listener in a rendered sound scene.

Each of the parallel paths comprises a variable gain device 181, 191 which is controlled by the distance block 160.

The perception of distance can be controlled by controlling relative gain between the direct path and the indirect (decorrelated) paths. Increasing the indirect path gain relative to the direct path gain increases the perception of distance.

In the direct path, the input signal 187 is amplified by variable gain device 181, under the control of the positioning block 160, to produce a gain-adjusted signal 183. The gain-adjusted signal 183 is processed by a direct processing module 182 to produce a direct multichannel audio signal 185.

In the indirect path, the input signal 187 is amplified by variable gain device 191, under the control of the positioning block 160, to produce a gain-adjusted signal 193. The gain-adjusted signal 193 is processed by an indirect processing module 192 to produce an indirect multichannel audio signal 195.

The direct multichannel audio signal 185 and the one or more indirect multichannel audio signals 195 are mixed in the mixer 196 to produce the output multichannel audio signal 197.

The direct processing block 182 and the indirect processing block 192 both receive direction of arrival signals 188. The direction of arrival signal 187 gives the orientation Arg(z) of the portable microphone 110 (moving sound object) in the recorded sound scene 10.

Figure 4A:
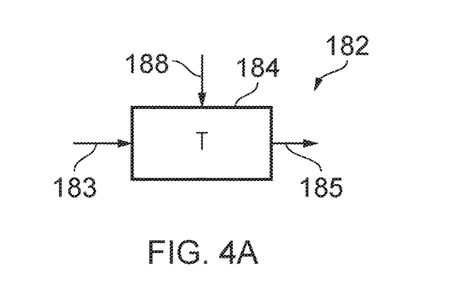
FIGS. 4A and 4B illustrate examples of a direct module and an indirect module for use in the module of FIG. 3.

The direct module 182 may, for example, include a system 184 similar to that illustrated in FIG. 4A that rotates the single channel audio signal, gain-adjusted input signal 183, in the appropriate multichannel space producing the direct multichannel audio signal 185.

The system 184 uses a transfer function to perform a transformation T that rotates multichannel signals within the space defined for those multiple channels by Arg(z), defined by the direction of arrival signal 188. For example, a head related transfer function (HRTF) interpolator may be used for binaural audio. As another example, vector base amplitude panning (VBAP) may be used for loudspeaker format audio.

Figure 4B:
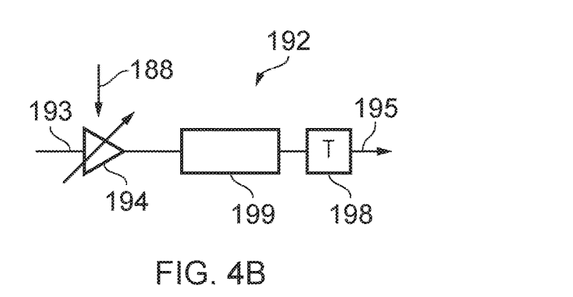

The indirect module 192 may, for example, be implemented as illustrated in FIG. 4B. In this example, the direction of arrival signal 188 controls the gain of the single channel audio signal, the gain-adjusted input signal 193, using a variable gain device 194. The amplified signal is then processed using a static decorrelator 199 and then a system 198 that applies a static transformation T to produce the output multichannel audio signals 195. The static decorrelator in this example use a pre-delay of at least 2 ms. The transformation T rotates multichannel signals within the space defined for those multiple channels in a manner similar to the system 184 but by a fixed amount. For example, a static head related transfer function (HRTF) interpolator may be used for binaural audio.

It will therefore be appreciated that the module 170 can be used to process the portable microphone signals 112 and perform the function of changing the relative position (orientation Arg(z) and/or distance |z|) of a sound object, represented by a portable microphone audio signal 112, from a listener in the rendered sound scene.

Figure 5:
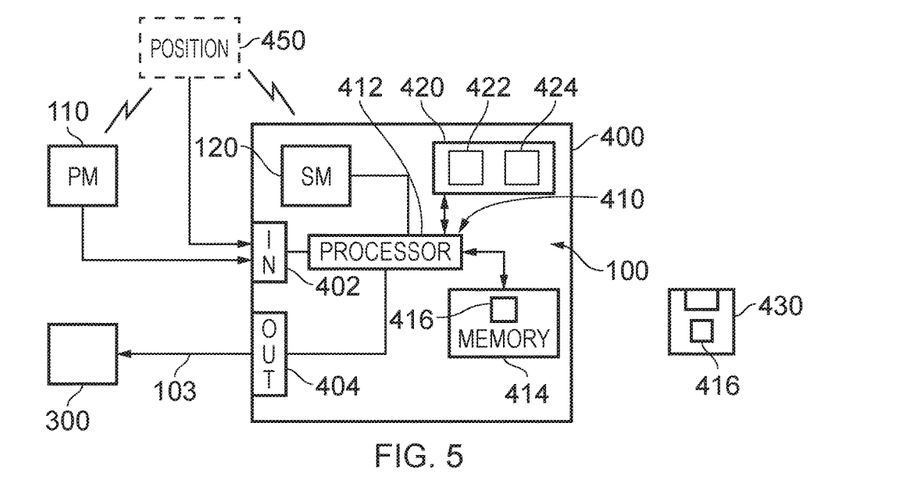
FIG. 5 illustrates an example of the system implemented using an apparatus.

FIG. 5 illustrates an example of the system 100 implemented using an apparatus 400, for example, a portable electronic device. The portable electronic device may, for example, be a hand-portable electronic device that has a size that makes it suitable to carried on a palm of a user or in an inside jacket pocket of the user.

In this example, the apparatus 400 comprises the static microphone 120 as an integrated microphone but does not comprise the one or more portable microphones 110 which are remote. However, in other examples the apparatus does not comprise the static microphone or microphones. In this example, but not necessarily all examples, the static microphone 120 is a microphone array.

The apparatus 400 comprises an external communication interface 402 for communicating externally to receive data from the remote portable microphone 110 and any additional static microphones or portable microphones. The external communication interface 402 may, for example, comprise a radio transceiver.

A positioning system 450 is illustrated. This positioning system 450 is used to position the portable microphone 110 relative to the static microphone 120. In this example, the positioning system 450 is illustrated as external to both the portable microphone 110 and the apparatus 400. It provides information dependent on the position z of the portable microphone 110 relative to the static microphone 120 to the apparatus 400. In this example, the information is provided via the external communication interface 402, however, in other examples a different interface may be used. Also, in other examples, the positioning system may be wholly or partially located within the portable microphone 110 and/or within the apparatus 400.

The position system 450 provides an update of the position of the portable microphone 110 with a particular frequency and the terms 'accurate' and 'inaccurate' positioning of the sound object should be understood to mean accurate or inaccurate within the constraints imposed by the frequency of the positional update. That is accurate and inaccurate are relative terms rather than absolute terms.

The apparatus 400 wholly or partially operates the system 100 and method 200 described above to produce a multi-microphone multichannel audio signal 103.

The apparatus 400 provides the multi-microphone multichannel audio signal 103 via an output communications interface 404 to an audio output device 300 for rendering.

In some but not necessarily all examples, the audio output device 300 may use binaural coding. Alternatively or additionally, in some but not necessarily all examples, the audio output device may be a head-mounted audio output device.

In this example, the apparatus 400 comprises a controller 410 configured to process the signals provided by the static microphone 120 and the portable microphone 110 and the positioning system 450. In some examples, the controller 410 may be required to perform analogue to digital conversion of signals received from microphones 110, 120 and/or perform digital to analogue conversion of signals to the audio output device 300 depending upon the functionality at the microphones 110, 120 and audio output device 300. However, for clarity of presentation no converters are illustrated in FIG. 5. Implementation of a controller 410 may be as controller circuitry. The controller 410 may be implemented in hardware alone, have certain aspects in software including firmware alone or can be a combination of hardware and software (including firmware).

As illustrated in FIG. 5 the controller 410 may be implemented using instructions that enable hardware functionality, for example, by using executable instructions of a computer program 416 in a general-purpose or special-purpose processor 412 that may be stored on a computer readable storage medium (disk, memory etc) to be executed by such a processor 412.

The processor 412 is configured to read from and write to the memory 414. The processor 412 may also comprise an output interface via which data and/or commands are output by the processor 412 and an input interface via which data and/or commands are input to the processor 412.

The memory 414 stores a computer program 416 comprising computer program instructions (computer program code) that controls the operation of the apparatus 400 when loaded into the processor 412. The computer program instructions, of the computer program 416, provide the logic and routines that enables the apparatus to perform the methods illustrated in FIG. 1-15. The processor 412 by reading the memory 414 is able to load and execute the computer program 416.

As illustrated in FIG. 5, the computer program 416 may arrive at the apparatus 400 via any suitable delivery mechanism 430. The delivery mechanism 430 may be, for example, a non-transitory computer-readable storage medium, a computer program product, a memory device, a record medium such as a compact disc read-only memory (CD-ROM) or digital versatile disc (DVD), an article of manufacture that tangibly embodies the computer program 416. The delivery mechanism may be a signal configured to reliably transfer the computer program 416. The apparatus 400 may propagate or transmit the computer program 416 as a computer data signal.

Although the memory 414 is illustrated as a single component/circuitry it may be implemented as one or more separate components/circuitry some or all of which may be integrated/removable and/or may provide permanent/semi-permanent/dynamic/cached storage.

Although the processor 412 is illustrated as a single component/circuitry it may be implemented as one or more separate components/circuitry some or all of which may be integrated/removable. The processor 412 may be a single core or multi-core processor.

The foregoing description describes a system 100 and method 200 that can position a sound object within a rendered sound scene. The system as described has been used to correctly position the sound source within the rendered sound scene so that the rendered sound scene accurately reproduces the recorded sound scene. However, the inventors have realized that the system 100 may also be used to control how a sound scene is rendered.

For example, by positioning the sound source within the rendered sound scene by controlling z. In this context, incorrectly positioning means to deliberately misposition the sound source within the rendered sound scene so that the rendered sound scene is deliberately, by design, not an accurate reproduction of the recorded sound scene because the sound source is incorrectly positioned.

For example, by controlling the audio properties of one sound source relative to the sound scene. This may, for example, be achieved by controlling the variable gain devices 181, 191 or using differential weightings applied to the inputs of mixers, for example, mixers 102, 196. As an example, a sound source may be repositioned by selecting a suitable HRTF filter which corresponds to the transfer function from the desired direction to a listener's ear, when using binaural audio. As another example, VBAP methods can be used to adjust the gains of the sound source when it is panned to different loudspeaker channels.

The incorrect positioning may, for example, involve controlling a position of the sound object relative to the listener by controlling the value z as an input to the positioning block 140. The incorrect positioning may, for example, involve controlling an orientation Arg(z) of the sound object and/or controlling a perceived distance of the sound object |z|.

The position of a particular sound object may be controlled independently of other sound objects so that it is incorrectly positioned while they are correctly positioned.

The incorrect positioning of a particular sound object may be achieved by altering the input to the positioning block 140 in the method and system described above.

Correct rendering of a subject sound object comprises at least rendering the subject sound object at a correct position within a rendered sound scene compared to a recorded sound scene. If the rendered sound scene and the recorded sound scene are aligned so that selected sound objects in the scenes have aligned positions in both scenes then the position of the subject sound object in the rendered sound scene is aligned with the position of the subject sound object in the recorded sound scene. The system 100 and method 200 can correctly render a subject sound object.

Incorrect rendering of a subject sound object comprises at least rendering of the subject sound object at an incorrect position in a rendered sound scene compared to a recorded sound scene or not rendering the sound object in the rendered sound scene. The system 100 and method 200 can incorrectly render a subject sound object.

Rendering of the subject sound object at an incorrect position in a rendered sound scene means that if the rendered sound scene and the recorded sound scene are aligned so that selected sound objects in the scenes have aligned positions in both scenes then the position of the subject sound object in the rendered sound scene is not aligned, and is deliberately and purposefully misaligned with the position of the subject sound object in the recorded sound scene.

Not rendering the sound object in the rendered sound scene means suppressing that sound object so that it has no audio output power, that is, muting the sound object. Not rendering a sound object in a sound scene may comprise not rendering the sound object continuously over a time period or may comprise rendering the sound object less frequently during that time period.

Correct positioning of a sound object involves rendering the sound object in a correct position relative to the other sound objects in the rendered sound scene. The system 100 and method 200 can correctly position a subject sound object. Incorrect positioning of a sound object involves rendering the sound object in a deliberately incorrect position relative to the other sound objects in the rendered sound scene, whether or not the rendered sound scene is reoriented relative to a head-mounted audio device. The system 100 and method 200 can incorrectly position a subject sound object.

Figure 6:
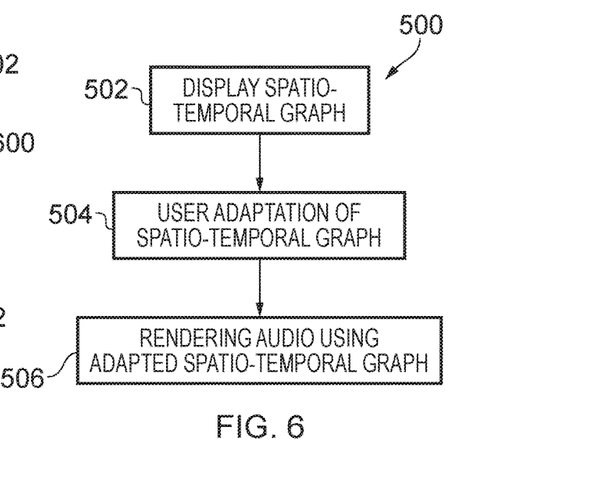
FIG. 6 illustrates an example of a method for controlling the rendering of audio.

FIG. 6 illustrates an example of a method 500 for controlling the rendering of audio.

The method 500, at block 502, comprises displaying a spatio-temporal graph 600 that visually indicates the positions z(t) of a sound object at each time t in a range of times and, in addition, simultaneously indicates a state of the sound object over the range of times and positions.

The method 500, at block 504, comprises enabling user adaptation of the spatio-temporal graph 600 to change a position of the sound object during at least a portion of the range of times and/or a state of the sound object over at least a portion of the range of times.

The method 500, at block 506, comprises enabling rendering of audio using the position and state of the sound object indicated by the adapted spatio-temporal graph.

Figure 7:
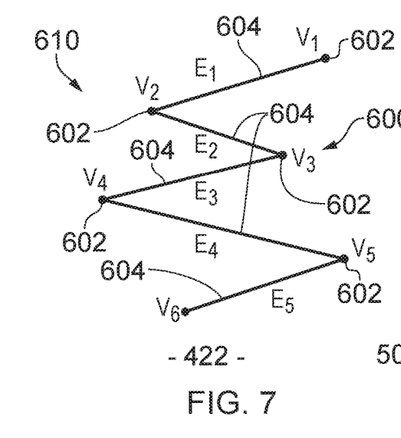
FIG. 7 illustrates an example of a graphical user interface that includes a spatio-temporal graph that is used to control rendering of audio.

FIG. 7 illustrates a graphical user interface 610 that includes the spatio-temporal graph 600 that is used to control rendering of audio. The graphical user interface 610 is provided via a user input/user output system 420 as illustrated in FIG. 5.

The user input/user output system 420 is configured to provide input control signals to the controller 410 and to receive output control signals from the controller 410.

The user input/user output system 420 enables user input to the apparatus 400 and user output from the apparatus 400. The user input/user output system 420 comprises at least a display 422 for enabling user output from the apparatus 400. The display 422 may be any device that enables visual perception of an image. The display 422 may, for example, be a display screen such as a liquid crystal display screen or an organic light emitting diode (OLED) display screen, or it may be a projector or near eye display, for example.

The user input/user output system 420 comprises at least a user input device 424 for enabling user input to the apparatus 400.

A graphical user interface 610 enables a user to provide user input via items displayed in the display 422. This may, for example, be by using a cursor to select and move a displayed item or by using a touch screen in combination with a display screen to allow a user to touch the displayed item and move it.

The graphical user interface 610 enables user adaptation of the spatio-temporal graph 600. For example, the graphical user interface 610 enables user adaptation of a shape of the spatio-temporal graph 600 to control positions of the sound object. For example, in addition or alternatively, the graphical user interface 610 enables user adaptation of an appearance of the spatio-temporal graph 600 to control a state of the sound object at different times.

In this example, but not necessarily all examples, the spatio-temporal graph has N vertices 602, at N different display locations, and N−1 edges 604. It relates to a defined time range $\Delta t$.

Each vertex $V_n$ 602 has a display location $D_n(x_n, y_n)$ defined by a position $z(t_n)$ of the sound object at a specific time $t_1$ in the time range $\Delta t$. Each of the N−1 edges $E_n$ 604 is between two vertices $(V_n, V_{n+1})$ 602 that are at adjacent specific times $(t_n, t_{n+1})$.

For example, vertex $V_1$ 602 has a display location $D_1(x_1, y_1)$ defined by a position $z(t_1)$ of the sound object at a specific time $t_1$ in the time range $\Delta t = t_N - t_1$, where N=6. Vertex $V_2$ 602 has a display location $D_2(x_2, y_2)$ defined by a position $z(t_2)$ of the sound object at a specific time $t_2$ in the time range $\Delta t$. The edge $E_1$ 604 is between vertices $V_1$ and $V_2$ that are at adjacent specific times $t_1$, $t_2$.

Vertex $V_3$ 602 has a display location $D_3(x_3, y_3)$ defined by a position $z(t_3)$ of the sound object at a specific time $t_3$ in the time range $\Delta t$. The edge $E_2$ 604 is between vertices $V_2$ and $V_3$ that are at adjacent specific times $t_2$, $t_3$.

Vertex $V_4$ 602 has a display location $D_4(x_4, y_4)$ defined by a position $z(t_4)$ of the sound object at a specific time $t_4$ in the time range $\Delta t$. The edge $E_3$ 604 is between vertices $V_3$ and $V_4$ that are at adjacent specific times $t_3$, $t_4$.

Vertex $V_5$ 602 has a display location $D_5(x_5, y_5)$ defined by a position $z(t_5)$ of the sound object at a specific time $t_5$ in the time range $\Delta t$. The edge $E_4$ 604 is between vertices $V_4$ and $V_5$ that are at adjacent specific times $t_4$, $t_5$.

Vertex $V_6$ 602 has a display location $D_6(x_6, y_6)$ defined by a position $z(t_6)$ of the sound object at a specific time $t_6$ in the time range $\Delta t$. The edge $E_5$ 604 is between vertices $V_5$ and $V_6$ that are at adjacent specific times $t_5$, $t_6$.

A display location is a unique location within the display. In the above example it has been assumed that a display location $D_n(x_n, y_n)$ is defined in a rectangular display as $x_n$ horizontal pixels and $y_n$ vertical pixels. However other coordinate systems and methods may be used to define a display location.

A visual appearance of different portions of the spatio-temporal graph 600 may indicate a state of the sound object over the range of times $\delta t$ and positions $z(\delta t)$ associated with that portion. The portion or portions may be a whole edge 604, a part of a length of an edge 604 or some combination of a whole edge or edges 604 and a part or parts of a length of an edge or edges 604.

The spatio-temporal graph 600 is dependent upon couplet $\{t, z(t)\}$ each couplet comprising as components a time t, and a position z(t) of the sound object. The time component t and position component z(t) of a couplet define a display location D(t) at which the couplet is represented in the display 422 by the spatio-temporal graph 600.

Each couplet $\{t, z(t)\}$ may be extended to form a triplet $\{t, z(t), S(t)\}$ which comprises in addition to the time component t and position component z(t), a state component S(t).

The state component S(t) of the triplet may define an appearance of the spatio-temporal graph at the display location D(t).

The time component t may be represented by a value x along a time axis and the position z(t) component may be represented by a value along a position axis or axes. In the example of FIG. 7, the spatio-temporal graph 600 maps combinations of time and a position of the sound object to a display location defined in a co-ordinate system spanned by a first vector representing time and one or more second vectors representing the position of the sound object. The first vector and the one or more second vectors are mutually orthogonal. The first vector is a vertical time axis and the one or more second vectors are horizontal.

The graphical user interface 610 may be configured to enable a user to control a scale for the time axis and/or a length of the time axis and/or a position of the time axis.

The spatio-temporal graph 600 represents all of the couplets/triplets over the time range Δt.

In some examples, the spatio-temporal graph 600 while representing all of the couplet/triplets over the time range Δt, uses each couplet/triplet as a vertex V of the spatio-temporal graph 600.

In other examples, the spatio-temporal graph 600 while representing all of the couplets/triplets over the time range Δt, uses only a sub-set of the couplets/triplets as vertices V of the spatio-temporal graph 600. The couplets/triplets that are not in that sub-set are represented visually by the edges between vertices V.

The selection of whether or not all couplets/triplets produce vertices and, if they do not which sub-set of couplets/triplets produce vertices may be user programmed or automatically determined.

Referring back to FIG. 6, block 504, enables user adaptation of the spatio-temporal graph 600. This may, for example, comprise changing a display location $D_n$ of one or more vertices $V_n$ to define new display locations $D_n'$ of one or more vertices.

The original display location $D_n$ has an time t and position z(t) that defines that display location $D_n$. The new display location $D_n'$ has a time t' and position z' (t') that defines that new display location $D_n'$. Changing the display location $D_n$ of a vertex $V_n$ changes the couplet/triplet so that its time component is no longer t but t' and so that its position component is no longer z(t) but z' (t'). The state component of the triplet is unchanged S(t)=S(t') as a consequence of relocating a vertex V. Of course relocating a vertex may change t but not z(t) e.g. a vertical relocation, or z(t) but not t e.g. a horizontal relocation or change t and z(t) e.g. a relocation with a vertical component and a vertical component.

Changing a location of a vertex $V_n$ also adapts the preceding edge $E_{n-1}$ and the following edge $E_n$. A change in display location of a portion of the spatio-temporal graph 600 representing a couplet/triplet results in a corresponding change in the time component and/or position component of that couplet/triplet.

If the preceding edge $E_{n-1}$ visually represents one of more couplets/triplets then those couplets/triplets may also be adapted. If the following edge $E_n$ visually represents one of more couplets/triplets then those couplets/triplets may also be adapted. The time component and the position component of the couplet/triplet are changed by an amount corresponding to the amount a display location of the portion of the edge of the spatio-temporal graph 600 representing the triplet is changed. For example, if the portion of an edge E representing a couplet $\{t_m, z(t_m)\}$/triplet $\{t_m, z(t_m), S(t_m)\}$ has an original display location $D(x_i, y_i)$ corresponding to time component $t_i$ and position component $z(t_i)$ before adaptation and has a new display location $D(x_j, y_j)$ corresponding to time component $t_j$ and position component $z(t_j)$ after adaptation, then the couplet becomes $\{t_m+(t_j-t_i), z(t_m)+(z(t_j)-z(t_i))\}$ and the triplet becomes $\{t_m+(t_j-t_i), z(t_m)+(z(t_j)-z(t_i)), S(t_m)\}$. Thus the time component and the position component of the couplet/triplet are adapted by an amount corresponding to the amount a location of the spatio-temporal graph 600 representing the couplet/triplet is adapted.

A display location D of a vertex V may be changed by enabling user selection of the vertex V and enabling movement of the selected vertex V to a new display location D'. This may be achieved using a 'drag and drop' operation via the graphical user interface 610.

In some but not necessarily all examples, enabling user adaptation of the spatio-temporal graph 600 may comprise enabling the addition and/or the removal of vertices V 602. Thus an edge 604 may be subdivided into multiple edges 604 or multiple edges 604 may be combined to a single edge 604. The removal/addition of vertices 602/edges 604 may occur as a consequence of a user adding a vertex 602 or removing a vertex 602 or adding an edge 604 or removing an edge 604 or may occur automatically as a consequence of a user moving a vertex 602.

The graphical user interface 610 may enable user adaptation of the spatio-temporal graph 600 by allowing a user to change a visual appearance of a portion of the spatio-temporal graph to control a state of the sound object for the times and positions associated with that portion. As previously described, there is a mapping from an original state S(t) of a sound object to the appearance before adaptation of the spatio-temporal graph 600 at the display location associated with the time component t and the position component z(t) of the triplet {t, z(t), S(t)}. There is also an equivalent reverse mapping from the appearance of the spatio-temporal graph 600, after adaptation, to a new state S'(t) at the display location associated with the time component t and the position component z(t) of the adapted triplet {t, z(t), S'(t)}.

An appearance of a portion of a spatio-temporal graph 600 may be changed by enabling user selection of the portion and enabling user control of an appearance of the selected portion.

Enabling user adaptation of an appearance of the spatio-temporal graph 600 may for example comprise displaying the edges 604 of the spatio-temporal graph 600 with a thickness X(t) and enabling user adaptation of the thickness X(t).

For example, the user may squeeze an edge 604 of the spatio-temporal graph to control the thickness of the edge 604 which in turn controls the state S(t) of the sound object for a time duration associated with the edge 604. This may be achieved by selecting the edge 604 and performing a pinch gesture on a touch screen.

For example, the user may pinch multiple edges 604 of the spatio-temporal graph 600 simultaneously to control the thickness of the multiple edges 604 which in turn controls the state of the sound object for a time duration associated with the multiple edges 604.

It should be appreciated from the foregoing that each component of a couplet/triplet can be separately and independently controlled by controlling a display location or appearance of the portion of the spatio-temporal graph 600 corresponding to that portion. The portion may most conveniently be referred to in terms of time t because for any time t there only exists a single couplet/triplet for each sound source.

The state of a sound object may be selected from multiple different states. The current state, if any, that determines the appearance of the spatio-temporal graph 600 and which can be adapted by adapting the appearance of the spatio-temporal graph 600 may, for example, be selected from a drop-down menu comprising the multiple different states as a list.

Where a state is selected the spatio-temporal graph 600 is defined by triplets having as a third component a state component for the selected state. The state component determines the appearance of the spatio-temporal graph 600 at different portions.

Where a state is not selected the spatio-temporal graph 600 is defined by couplets without a state component for the selected state.

A state may for example be a property of the sound object such as its importance. Importance may be a parameter used for controlling automatic processing of multiple different audio objects, so that some sound objects have a greater weighting than other sound objects.

A state may for example be an audio property of the sound object such as amplitude of audio (volume), reverb (many sound reflections occurring in a very short space of time), compression (reducing the dynamic range of a signal) or another effect such as expansion (increasing the dynamic range of a signal), equalization (changing the frequency distribution of a signal).

At least some of these effects may be achieved by adapting the control parameters of the variable gain devices 181, 191 or using differential weightings applied to the inputs of mixers, for example, mixers 102, 196 or changing the static decorrelator pre-delay. The gain in the direct path is varied using the variable gain device 181. The gain in the indirect path using variable gain device 191. There may be a library of common audio processing effects which may be utilized.

Figure 8:
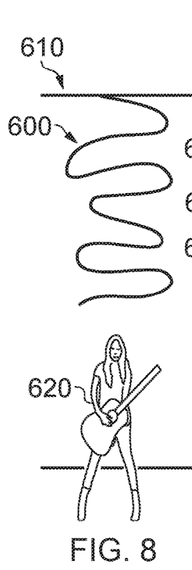
FIG. 8 illustrates another example of a graphical user interface that includes a spatio-temporal graph that is used to control rendering of audio.

FIG. 8 illustrates an example of a graphical user interface 610 comprising a spatio-temporal graph 600, as previously described, and a visual representation 620 of the sound object associated with the spatio-temporal graph 600. In this example, the sound object is a sound source.

A movement trajectory z(t) has been mapped to the display, as the spatio-temporal graph 600 above the visual representation 620 of the sound object, by mapping time t to a time axis that extends vertically downwards and by mapping z(t) to a horizontal axis (or orthogonal horizontal axes).

Figures 9, 10, 11:
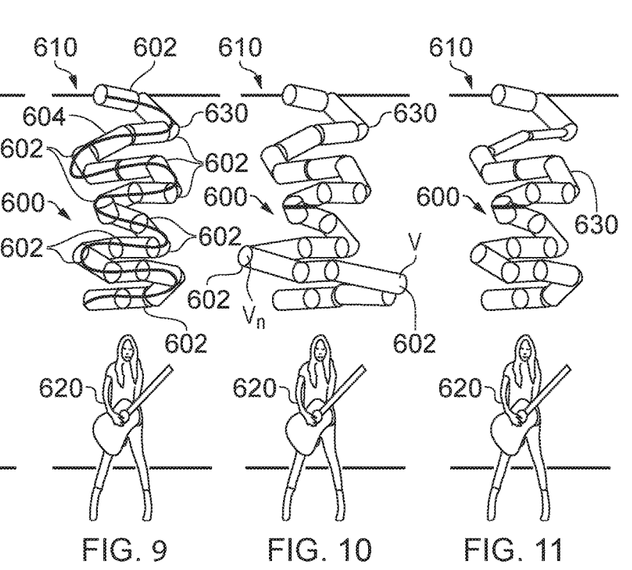
FIG. 9 illustrates another example of a graphical user interface that includes a spatio-temporal graph that is used to control rendering of audio.
FIG. 10 illustrates an example of an adaptation to the spatio-temporal graph illustrated in FIG. 9 performed using the graphical user interface.
FIG. 11 illustrates an example of an adaptation to the spatio-temporal graph illustrated in FIG. 9 performed using the graphical user interface.

FIG. 9 illustrates another example of a graphical user interface 610 comprising a spatio-temporal graph 600, as previously described, and a visual representation 620 of the sound object associated with the spatio-temporal graph 600. In this example, the sound object is a sound source.

The spatio-temporal graph 600 comprises an enclosing shape 630, having outer bounds defined by the positions z(t) of the sound object at each one of a plurality of specific times in the range of times. In this example, the enclosing shape 630 is a three-dimensional enclosing shape. The enclosing shape 630 is a large scale approximation to the trajectory illustrated in FIG. 8.

The edges 604 of the spatio-temporal graph have a thickness X(t) and have a three-dimensional shape, in this example. They have a tubular shape and the thickness X(t) corresponds to a diameter of the tube.

FIG. 10 illustrates an adaptation to the spatio-temporal graph 600 illustrated in FIG. 9 performed using the graphical user interface 610.

The spatio-temporal graph 600 is adapted by changing a display location $D_n$ of one or more vertices 602 to define new display locations $D_n'$ of one or more vertices 602.

Changing a location of a vertex $V_n$ also adapts the preceding edge $E_{n-1}$ and the following edge $E_n$. A change in display location of a portion of the spatio-temporal graph 600 results in a corresponding change in the timing and/or positioning of the audio associated with that portion. A display location of a vertex 602 may be changed by enabling user selection of the vertex 602 and enabling movement of the selected vertex 602 to a new display location. This may be achieved using a 'drag and drop' operation via the graphical user interface 610.

FIG. 11O illustrates an adaptation to the spatio-temporal graph 600 illustrated in FIG. 9 performed using the graphical user interface 610.

The spatio-temporal graph 600 is adapted by changing a display location of one or more edges 604. A change in display location of a portion of the spatio-temporal graph 600 results in a corresponding change in the timing and/or positioning of the audio associated with that portion.

A display location of an edge 604 may be changed by enabling user selection of the edge and enabling a pinch operation to be performed on the edge 604. This operation, in the absence of selection of a state for display, causes the couplets associated with the edge to be constrained to have values corresponding to display locations within the boundary of the newly defined edge 604.

Figures 12A, 12B:
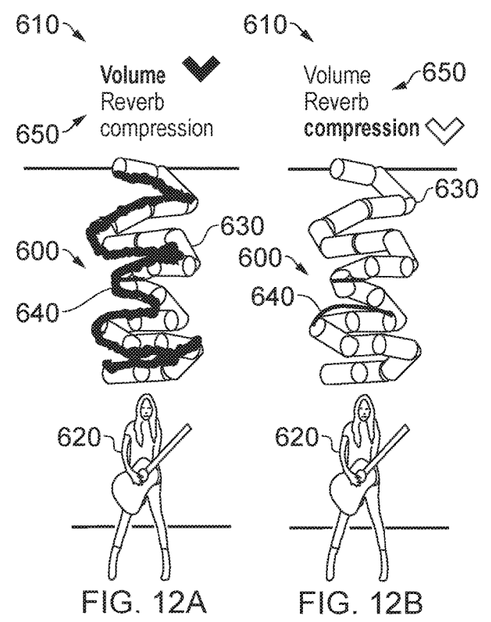
FIGS. 12A and 12B illustrate the spatio-temporal graph illustrated in FIG. 9 having an appearance dependent upon a selected state.

FIGS. 12A and 12B illustrate the spatio-temporal graph 600 illustrated in FIG. 9 having an appearance dependent upon a selected state. In FIG. 12A the selected state is 'volume' and in FIG. 12B the selected state is 'compression'.

In FIG. 12A a trace 640 illustrates how the volume state $S_V(t)$ varies with time. The spatio-temporal graph 600 represents the triplets $\{t, z(t), S_V(t)\}$. The trace 640 plots $S_V(t)$ and the appearance of the spatio-temporal graph 600 is dependent upon $S_V(t)$.

In FIG. 12B a trace 640 illustrates how the compression state $S_C(t)$ varies with time. The spatio-temporal graph 600 represents the triplets $\{t, z(t), S_C(t)\}$. The trace 640 plots $S_C(t)$ and the appearance of the spatio-temporal graph 600 is dependent upon $S_C(t)$.

The state of a sound object may be selected from multiple different states. The current state that determines the appearance of the spatio-temporal graph 600 and which can be adapted by adapting the appearance of the spatio-temporal graph 600 may, for example, be selected from a drop-down menu 650 comprising the multiple different states as a list.

In FIG. 12B, the trace 640 may be drawn onto the spatio-temporal graph 600 by a user.

Figure 13:
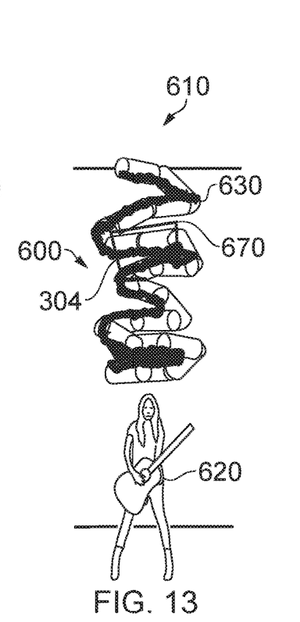
FIG. 13 illustrates an example of an adaptation to the spatio-temporal graph illustrated in FIG. 12A performed using the graphical user interface.

FIG. 13 illustrates an adaptation to the spatio-temporal graph 600 illustrated in FIG. 12A performed using the graphical user interface 610.

The spatio-temporal graph 600 is adapted by changing a visual appearance of a portion 670 of the spatio-temporal graph 600 to control a state of the sound object for the times and positions associated with that portion 670. An appearance of a portion 670 of a spatio-temporal graph 600 may be changed by enabling user selection of the portion 670 and enabling user control of an appearance of the selected portion.

For example, the user may squeeze an edge 604 of the spatio-temporal graph 600 to control the thickness of the edge 604 which in turn controls the state S(t) of the sound object for a time duration associated with the edge. This may be achieved by selecting the edge 604 and performing a pinch gesture on a touch screen.

Figure 14A:
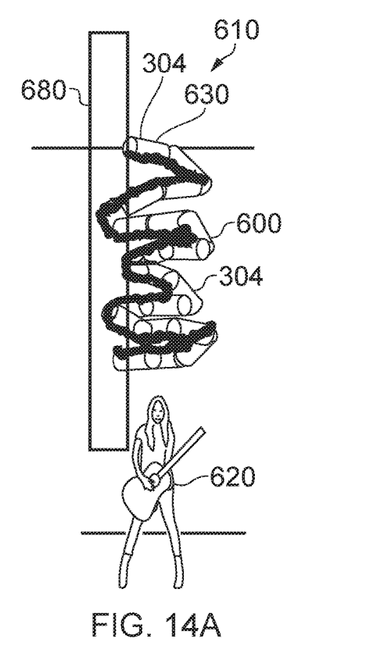
FIGS. 14A and 14B illustrate an example of an adaptation to the spatio-temporal graph illustrated in FIG. 12A performed using the graphical user interface.
Figure 14B:
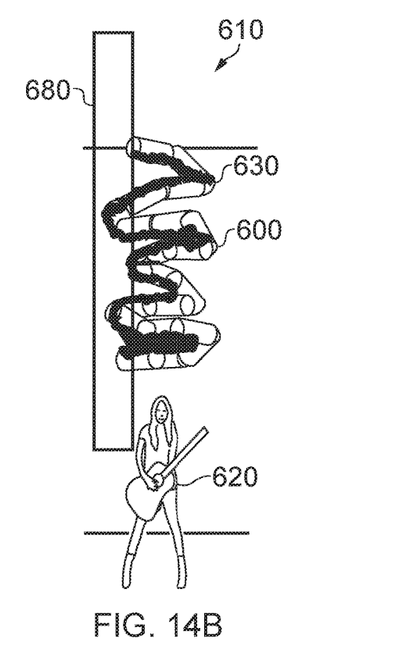

FIGS. 14A and 14B illustrate an adaptation to the spatio-temporal graph 600 illustrated in FIG. 12A performed using the graphical user interface 610. FIG. 14A illustrates before an adaptation and FIG. 14B illustrates after the adaptation.

The spatio-temporal graph 600 is adapted by changing a visual appearance of a portion 680 of the spatio-temporal graph 600 to control a state of the sound object for the times and positions associated with that portion 680. An appearance of a portion 680 of a spatio-temporal graph 600 may be changed by enabling user selection of the portion 680 and enabling user control of an appearance of the selected portion.

For example, the user may pinch multiple edges 304 of the spatio-temporal graph 600 simultaneously to control the thickness of the multiple edges 304 which in turn controls the state of the sound object for a time duration associated with the multiple edges 304.

Figure 15:
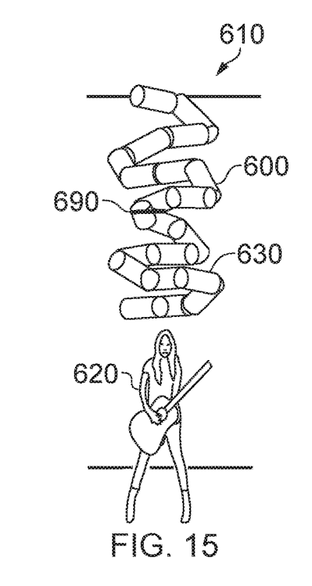
FIG. 15 illustrates an example of a graphical user interface that displays an indicator on the spatio-temporal graph.

In FIG. 15, the graphical user interface 610 displays an indicator 690 at a location on the spatio-temporal graph 600 that defines a subject time and a subject position of the sound object associated with the location of the indicator on the spatio-temporal graph. For example it defines a particular couplet/triplet.

The indicator 690 indicates a point in time from which rendering of audio using the position and state of the sound object indicated by the spatio-temporal graph 600 is occurring or will occur.

The graphical user interface 610 enables a user to control the location of the indicator 690 on the spatio-temporal graph 600. The user can move the indicator 690 forwards or backwards in time.

Figure 16:
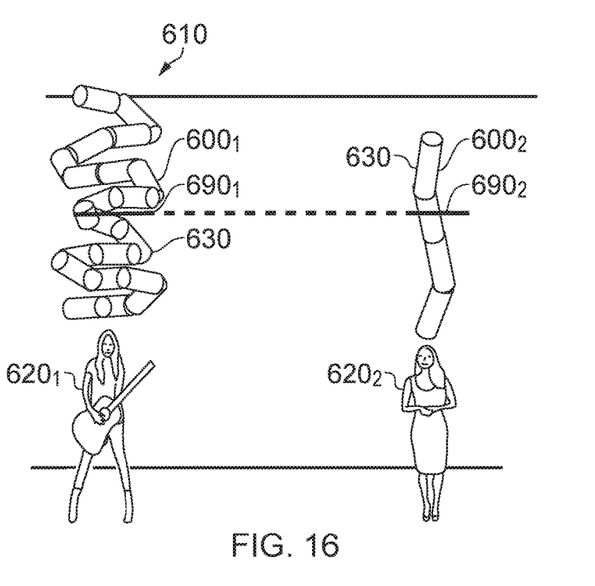
FIG. 16 illustrates an example of a graphical user interface comprising a first spatio-temporal graph for a first sound object and comprising a second spatio-temporal graph for a second sound object.

FIG. 16 illustrates an example of a graphical user interface 610 comprising a first spatio-temporal graph $600_1$ for a first sound object, as previously described, and a visual representation $620_1$ of the first sound object associated with the first spatio-temporal graph $600_1$. In this example, the first sound object is a sound source. The graphical user interface 610 also comprises a second spatio-temporal graph $600_2$ for a second sound object, as previously described, and a visual representation $620_2$ of the second sound object associated with the second spatio-temporal graph $600_2$. In this example, the second sound object is a sound source.

The description above provided in relation to the spatio-temporal graph 600 is as applicable to the first spatio-temporal graph $600_1$.

The description above provided in relation to the spatio-temporal graph 600 is as applicable to the second spatio-temporal graph $600_2$.

The first spatio-temporal graph $600_1$ visually indicates across different first display locations the positions of a first sound object at each time in a range of times. It may, as described above, in addition, simultaneously indicate a state of the first sound object over the range of times and positions.

The graphical user interface 610 enables user adaptation of the first spatio-temporal graph $600_1$ to change a position of the first sound object during at least a portion of the range of times and/or a state of the first sound object over at least a portion of the range of times.

The second spatio-temporal graph $600_2$ visually indicates across different second display locations the positions of a second sound object at each time in a range of times. It may, as described above, in addition, simultaneously indicate a state of the second sound object over the range of times and positions.

The graphical user interface 610 enables user adaptation of the second spatio-temporal graph $600_2$ to change a position of the second sound object during at least a portion of the range of times and/or a state of the second sound object over at least a portion of the range of times.

This enables rendering of audio mixing a first audio signal defined by at least the position and state of the first sound object indicated by the adapted first spatio-temporal graph $600_1$ and a second audio signal defined by at least the position and state of the second sound object indicated by the adapted second spatio-temporal graph $600_2$.

The graphical user interface 610 displays a first indicator $690_1$ at a location on the first spatio-temporal graph $600_1$ that defines a subject time and a subject position of the first sound object associated with the location of the indicator on the first spatio-temporal graph $600_1$. For example it defines a particular couplet/triplet of the first sound object. The first indicator $690_1$ indicates a point in time from which rendering of audio using the position and state of the first sound object indicated by the first spatio-temporal graph $600_1$ is occurring or will occur. The graphical user interface 610 enables a user to control the location of the first indicator $690_1$ on the first spatio-temporal graph $600_1$. The user can move the first indicator $690_1$ forwards or backwards in time.

The graphical user interface 610 displays a second indicator $690_2$ at a location on the second spatio-temporal graph $600_1$ that defines a subject time and a subject position of the second sound object associated with the location of the indicator on the second spatio-temporal graph $600_1$. For example it defines a particular couplet/triplet of the second sound object. The second indicator $690_2$ indicates a point in time from which rendering of audio using the position and state of the second sound object indicated by the second spatio-temporal graph $600_2$ is occurring or will occur. The graphical user interface 610 enables a user to control the location of the second indicator $690_2$ on the second spatio-temporal graph $600_2$. The user can move the second indicator $690_2$ forwards or backwards in time.

The user may, in some examples, be able to control the location of the first indicator $690_1$ and second indictor $690_2$ simultaneously and synchronously by changing a location of the first indicator $690_1$ or the second indictor $690_2$. The user may, in other examples, be able to control the location of the first indicator $690_1$ and second indictor $690_2$ independently.

It will be appreciated from the foregoing that the various methods 500 described may be performed by a computer program used by such an apparatus 400.

For example, an apparatus 400 may comprise:

at least one processor 412; and at least one memory 414 including computer program code the at least one memory 414 and the computer program code configured to, with the at least one processor 412, cause the apparatus 400 at least to perform:

causing display of a spatio-temporal graph that visually indicates the positions of a sound object at each time in a range of times and, in addition, simultaneously indicates a state of the sound object over the range of times;

causing enablement of user adaptation of the spatio-temporal graph to change a position of the sound object during at least a portion of the range of times and/or a state of the sound object over at least a portion of the range of times; and causing enablement of rendering of spatial audio output using the position and state of the sound object indicated by the adapted spatio-temporal graph.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

As used in this application, the term 'circuitry' refers to all of the following:

(a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) to circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in a server, a cellular network device, or other network device.

The blocks and methods illustrated in the FIG. 1-16 may represent steps in a method and/or sections of code in the computer program 416. The illustration of a particular order to the blocks does not necessarily imply that there is a required or preferred order for the blocks and the order and arrangement of the block may be varied. Furthermore, it may be possible for some blocks to be omitted.

Where a structural feature has been described, it may be replaced by means for performing one or more of the functions of the structural feature whether that function or those functions are explicitly or implicitly described.

As used here 'module' refers to a unit or apparatus that excludes certain parts/components that would be added by an end manufacturer or a user.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term 'example' or 'for example' or 'may' in the text denotes, whether explicitly stated or not, that such features or functions are present in at least the described example, whether described as an example or not, and that they can be, but are not necessarily, present in some of or all other examples. Thus 'example', 'for example' or 'may' refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A method comprising:
displaying a spatio-temporal graph that visually indicates one or more positions of a sound object in a range of times and indicates a state of the sound object over the range of times, wherein the state of the sound object relates to an audio property of the sound object;
enabling user adaptation of the spatio-temporal graph to change a position of the sound object in at least a portion of the range of times and/or change the state of the sound object over at least a portion of the range of times; and
rendering of spatial audio output, via an audio coder, using the position and the state of the sound object indicated by the adapted spatio-temporal graph.

2. A method as claimed in claim 1, wherein enabling user adaptation of the spatio-temporal graph comprising enabling adaptation of a shape of the spatio-temporal graph to control positions of the sound object and/or enabling adaptation of an appearance of the spatio-temporal graph to control the state of the sound object.

3. A method as claimed in claim 1, wherein the displayed spatio-temporal graph has N vertices, at N different display locations, and N−1 edges wherein each of the N vertices has a different display location defined by a position of the sound object at a different specific time in the range of times and wherein each of the N−1 edges is between two vertices that are at adjacent specific times and wherein a visual appearance of different portions of the spatio-temporal graph indicates the state of the sound object over the range of times and positions associated with that portion.

4. A method as claimed in claim 1, wherein enabling user adaptation of the spatio-temporal graph comprises: changing a position of one or more vertices of the spatio-temporal graph to define new adapted positions of the sound object at one or more times.

5. A method as claimed in claim 1, wherein enabling user adaptation of the spatio-temporal graph comprises: changing a visual appearance of a portion of the graph to control the state of the sound object for the times and positions associated with that portion.

6. A method as claimed in claim 1, wherein enabling user adaptation of the spatio-temporal graph comprises: squeezing an edge of the spatio-temporal graph to control the state of the sound object for a time duration associated with the edge and/or pinching multiple edges of the spatio-temporal graph simultaneously to control the state of the sound object for a time duration associated with the multiple edges.

7. A method as claimed in claim 1, wherein the spatio-temporal graph maps combinations of time and a position of the sound object to a display location defined in a co-ordinate system defined by a first vector representing time and one or more second vectors representing the position of the sound object, wherein the first vector and the one or more second vectors are mutually orthogonal.

8. A method as claimed in claim 1, wherein the spatio-temporal graph comprises an enclosing shape, having outer bounds defined by the positions of the sound object at each one of a plurality of specific times in the range of times.

9. A method as claimed in claim 1, comprising: displaying an indicator at a location on the spatio-temporal graph that defines a subject time and a subject position of the sound object associated with the location of the indicator on the spatio-temporal graph, wherein the indicator indicates a location from which rendering of audio using the position and state of the sound object indicated by the spatio-temporal graph is occurring or will occur.

10. A method as claimed in claim 1, comprising displaying a representation of the sound object.

11. An apparatus comprising at least one processor and at least one memory, the memory comprising machine-readable instructions, that when executed cause the apparatus to:
    display a spatio-temporal graph that visually indicates one or more positions of a sound object in a range of times and indicates a state of the sound object over the range of times, wherein the state of the sound object relates to an audio property of the sound object;
    enable user adaptation of the spatio-temporal graph to change a position of the sound object in at least a portion of the range of times and/or change the state of the sound object over at least a portion of the range of times; and
    enable rendering of spatial audio output, via an audio coder, using the position and the state of the sound object indicated by the adapted spatio-temporal graph.

12. The apparatus of claim 11, wherein enabling user adaptation of the spatio-temporal graph comprises enable adaptation of a shape of the spatio-temporal graph to control positions of the sound object and/or enable adaptation of an appearance of the spatio-temporal graph to control the state of the sound object.

13. The apparatus of claim 11, wherein the displayed spatio-temporal graph has N vertices, at N different display locations, and N−1 edges wherein each of the N vertices has a different display location defined by a position of the sound object at a different specific time in the range of times and wherein each of the N−1 edges is between two vertices that are at adjacent specific times and wherein a visual appearance of different portions of the spatio-temporal graph indicates the state of the sound object over the range of times and positions associated with that portion.

14. The apparatus of claim 11, wherein enabling user adaptation of the spatio-temporal graph comprises: change a position of one or more vertices of the spatio-temporal graph to define new adapted positions of the sound object at one or more times.

15. The apparatus of claim 11, wherein enabling user adaptation of the spatio-temporal graph comprises: change a visual appearance of a portion of the graph to control the state of the sound object for the times and positions associated with that portion.

16. The apparatus of claim 11, wherein enabling user adaptation of the spatio-temporal graph comprises: squeeze an edge of the spatio-temporal graph to control the state of the sound object for a time duration associated with the edge and/or pinch multiple edges of the spatio-temporal graph simultaneously to control the state of the sound object for a time duration associated with the multiple edges.

17. The apparatus of claim 11, wherein the spatio-temporal graph maps combinations of time and a position of the sound object to a display location defined in a co-ordinate system defined by a first vector representing time and one or more second vectors representing the position of the sound object, wherein the first vector and the one or more second vectors are mutually orthogonal.

18. The apparatus of claim 11, wherein the spatio-temporal graph comprises an enclosing shape, having outer bounds defined by the positions of the sound object at each one of a plurality of specific times in the range of times.

19. The apparatus of claim 11, further caused to: display an indicator at a location on the spatio-temporal graph that defines a subject time and a subject position of the sound object associated with the location of the indicator on the spatio-temporal graph, wherein the indicator indicates a location from which rendering of audio using the position and state of the sound object indicated by the spatio-temporal graph is occurring or will occur.

20. At least one non-transitory computer readable medium comprising instructions that, when executed, perform:
    display a spatio-temporal graph that visually indicates the positions of a sound object at each time in a range of times and, in addition, simultaneously indicates a state of the sound object over the range of times, wherein the state of the sound object relates to an audio property of the sound object;
    enable user adaptation of the spatio-temporal graph to change a position of the sound object during at least a portion of the range of times and/or the state of the sound object over at least a portion of the range of times; and
    enable rendering of spatial audio output, via an audio coder, using the position and the state of the sound object indicated by the adapted spatio-temporal graph.

* * * * *